(12) United States Patent
Ohshima

(10) Patent No.: US 8,403,231 B2
(45) Date of Patent: Mar. 26, 2013

(54) SEMICONDUCTOR DEVICE AND DRIVING METHOD THEREOF

(75) Inventor: Kazuaki Ohshima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1496 days.

(21) Appl. No.: 11/959,958

(22) Filed: Dec. 19, 2007

(65) Prior Publication Data

US 2008/0149737 A1 Jun. 26, 2008

(30) Foreign Application Priority Data

Dec. 25, 2006 (JP) ................................. 2006-346887

(51) Int. Cl.
*G06K 19/06* (2006.01)
*G06K 5/00* (2006.01)

(52) U.S. Cl. ........................................ 235/492; 235/380

(58) Field of Classification Search .................. 235/380, 235/381, 487, 492, 435, 439; 340/5.6, 5.61, 340/5.63–5.65, 572.1
See application file for complete search history.

(56) References Cited

U.S. PATENT DOCUMENTS

| | | | |
|---|---|---|---|
| 5,278,790 A * | 1/1994 | Kanabara | 365/189.05 |
| 5,517,460 A | 5/1996 | Yamaguchi | |
| 6,072,345 A | 6/2000 | Ooishi | |
| 6,323,728 B1 * | 11/2001 | Schmitt-Landsiedel et al. | 329/347 |
| 6,414,318 B1 | 7/2002 | Uber, III et al. | |
| 6,525,595 B2 | 2/2003 | Oku | |
| 6,683,809 B2 * | 1/2004 | Matsuda et al. | 365/185.18 |
| 6,809,498 B2 | 10/2004 | Nakamura et al. | |
| 6,960,955 B2 | 11/2005 | Nonaka | |
| 7,717,349 B2 | 5/2010 | Akiyama et al. | |
| 2001/0019511 A1 | 9/2001 | Kondo et al. | |
| 2001/0026187 A1 | 10/2001 | Oku | |
| 2002/0105829 A1 * | 8/2002 | Akamatsu | 365/185.18 |
| 2003/0121985 A1 | 7/2003 | Baldischweiler et al. | |
| 2004/0001453 A1 | 1/2004 | Kawai et al. | |
| 2004/0102176 A1 | 5/2004 | Hayashi et al. | |
| 2005/0046464 A1 | 3/2005 | Kobayashi et al. | |
| 2005/0133605 A1 | 6/2005 | Koyama et al. | |
| 2006/0007771 A1 * | 1/2006 | Sato | 365/226 |
| 2006/0022798 A1 * | 2/2006 | Akiyama et al. | 340/10.1 |
| 2009/0264163 A1 * | 10/2009 | Watanabe et al. | 455/572 |

FOREIGN PATENT DOCUMENTS

| | | |
|---|---|---|
| EP | 0 587 445 A2 | 3/1994 |
| EP | 0 762 307 A2 | 3/1997 |
| EP | 1 263 114 A2 | 12/2002 |
| EP | 1 722 284 A2 | 11/2006 |
| EP | 1 724 649 A2 | 11/2006 |
| EP | 1 729 187 A2 | 12/2006 |
| JP | 5-346978 | 12/1993 |

(Continued)

*Primary Examiner* — Thien M Le
*Assistant Examiner* — April Taylor
(74) *Attorney, Agent, or Firm* — Husch Blackwell LLP

(57) ABSTRACT

To provide a semiconductor device, which is capable of supplying a stable voltage to a memory and communicating wirelessly in writing data into a memory, and a driving method thereof. The semiconductor device is operated with periods which are divided into a period for receiving a signal wirelessly from a reader/writer, and a period for boosting up electric power received wirelessly from the reader/writer before being supplied to the memory. The signals transmitted from the reader/writer include timing for completion of signal transmission as information. The timing for completion of signal transmission is known by receiving the signals. After completion of signal transmission from the reader/writer, electric power received from the reader/writer starts to be boosted up, and then it is supplied to the memory in the semiconductor device.

15 Claims, 19 Drawing Sheets

FOREIGN PATENT DOCUMENTS

| | | |
|---|---|---|
| JP | 6-96303 | 4/1994 |
| JP | 6-150652 | 5/1994 |
| JP | 9-62804 | 3/1997 |
| JP | 11-250198 | 9/1999 |
| JP | 2001-250393 | 9/2001 |
| JP | 2003-88005 | 3/2003 |
| JP | 2003-123033 | 4/2003 |
| JP | 2003-348773 | 12/2003 |
| JP | 2004-23765 | 1/2004 |
| JP | 2006-40184 | 2/2006 |
| JP | 2006-293690 | 10/2006 |
| WO | WO 2006/028258 A1 | 3/2006 |

* cited by examiner 1102  1101  1103

US 8,403,231 B2

SEMICONDUCTOR DEVICE AND DRIVING METHOD THEREOF

BACKGROUND OF THE INVENTION

1. Field of the Invention

The present invention relates to a semiconductor device including a memory and having capability of performing wireless communication. In addition, the present invention relates to a driving method of the semiconductor device to determine timing of writing data into the memory.

2. Description of the Related Art

With development in computer technology, technology for information identification without contact has been a practical use and a memory performing a stable operation without contact has been needed. In response to such a demand, a wireless tag capable of communication without contact has been developed recently.

Some wireless tags include a function of memories. The memories, for example, can store data specific to the wireless tags, and data of programs for operating integrated circuits inside the wireless tags.

The wavelength of a radio wave transmitted and received between wireless tags and reader/writers, which are called interrogators, includes 125 kHz, 13.56 MHz, 915 MHz, 2.45 GHz, and the like. Each of the wavelength is standardized by ISO or the like. In addition, methods for modulation and demodulation in transmitting and receiving are standardized.

Wireless tags capable of generating electric power as a power supply voltage for operating the wireless tags from a radio wave also use the electric power which is generated from a radio wave in storing data into a memory. Normally, for storing data into the memory, a voltage which is obtained from a radio wave is utilized after being boosted up in the wireless tags.

For example, according to Patent Document 1 (Japanese Published Patent Application No. 2006-293690), when data is written into a memory, a voltage supplied to the memory is changed from 3.3V into 12.0 V, which is a higher voltage.

SUMMARY OF THE INVENTION

Electric power transmission to a wireless tag is conducted by electromagnetic coupling between an antenna for the wireless tag and an antenna for a reader/writer. Electric power transmitted by radio is converted into electric power for power supply voltage through a rectifier in the wireless tag and is supplied to various circuits. A radio wave is employed as a means to perform communication from the reader/writer to the wireless tag by modulating a radio wave as well as a means to supply electric power to the wireless tag from the reader/writer.

However, there has been a problem in that supply of electric power to the wireless tag tends to be unstable when a radio wave generated from the reader writer is modulated in order to perform communication from the reader/writer to the wireless tag. FIG. 17 shows a timing chart for boosting up a voltage supplied to the memory in parallel with performing communication from the reader/writer to the wireless tag. FIG. 17 shows, from the top, a change versus time in an alternating voltage generated by the antenna, a change versus time in a voltage before being boosted up VDD1 obtained by rectification of the alternating voltage, and a change versus time in a voltage VDD2, which is a voltage after being boosted up and supplied to the memory.

A period 2 in FIG. 17 is a period of a stop on communication from the reader/writer to the wireless tag, and generated voltage VDD1 stabilizes. As for period 1 in FIG. 17, it is a period of communication from the reader/writer to the wireless tag. In the period 1, the generated voltage VDD1 drops partially in synchronization with modulation of a radio signal. As a result, the voltage VDD2 obtained by boosting up the generated VDD1 also drops partially in synchronization with a modulation of a radio signal.

As can be seen in FIG. 17, when communication from the reader/writer to the wireless tag is performed, the voltage VDD1 generated in a power supply generation portion and the VDD 2 obtained by boosting up the voltage VDD1 tend to be unstable. Even if decrease in supply capability of a voltage in the power supply generation portion in the wireless tag is compensated by a storage capacitor, completely stable supply of a voltage has been impossible. Consequently, in the case of writing data into the memory in parallel with communication from the reader/writer to the wireless tag, it is difficult to secure a stable voltage for writing even if a boosting circuit is employed for boosting up a voltage.

In view of the above problem, an object of the present invention is to provide a semiconductor device which can stably supply a voltage to a memory and perform communication without wire in writing data into the memory, and a driving method thereof.

In the present invention, a semiconductor device is operated with periods divided into a period for wirelessly receiving a signal from the reader/writer, and a period for boosting up electric power wirelessly which is received from the reader/writer before supplying the electric power to a memory. A signal transmitted from the reader/writer includes timing for completion of a signal transmission (an EOF: end of frame) as information. The semiconductor device of the present invention determines the timing for completion of a signal transmission by receiving the signal. Then, after a transmission of the signal from the reader/writer is completed, electric power received from the reader/writer is started to be boosted up, and is supplied to the memory in the semiconductor device.

Specifically, a semiconductor device of the present invention includes the following: a memory; a boosting circuit; a identification circuit to identify command completion to identify timing to complete a transmission of the signal from the reader/writer; a boosting possibility circuit for identification of boosting possibility to control timing of boosting at the boosting circuit in accordance with the timing which is identified at the identification circuit to identify command completion. A voltage boosted up at the boosting circuit is supplied to the memory, and the memory writes data using the voltage boosted up.

Note that it is assumed that sometimes a signal transmitted from the reader/writer does not include a command to instruct writing data into the memory. In this case, after a transmission of the signal from the reader/writer is completed, it is not necessarily needed to start boosting up the voltage which is received from the reader/writer. Only when a command to instruct writing data into the memory is given, the voltage to be supplied to the memory may be boosted up.

The present invention stabilizes boosting and there is no limitation on a structure of a memory using a voltage which is boosted up by a boosting circuit.

A semiconductor device of the present invention may include an antenna or not. In the case of not including the antenna, the semiconductor device should have an input terminal to receive an alternating voltage generated in the external antenna.

The present invention makes it possible to control variation in a voltage after being boosted up due to a modulation of radio wave and to supply a stable voltage to a memory by operating a semiconductor device with dividing periods into a period of a signal transmission from a reader/writer and a period of boosting up a voltage. As a result, writing data into the memory can be stably conducted, whereby malfunction of the memory can be prevented.

Further, in the present invention, since a variation in voltage after being boosted up due to a modulation of a radio wave can be controlled, it is not required to adapt a boosting capability of a boosting circuit to minimum in the expectation of variation in a voltage. Thus, power consumption of the semiconductor device can be reduced.

DETAILED DESCRIPTION OF THE INVENTION

Hereinafter, embodiment modes and embodiments of the present invention will be described with reference to the drawings. However, the present invention can be implemented in many different modes, and it is easily understood by those skilled in the art that modes and details of the present invention can be modified in various ways without departing from the spirit and the scope of the present invention. Accordingly, the invention should not be construed as being limited to the embodiment modes and embodiments.

Embodiment Mode 1

Figure 1:
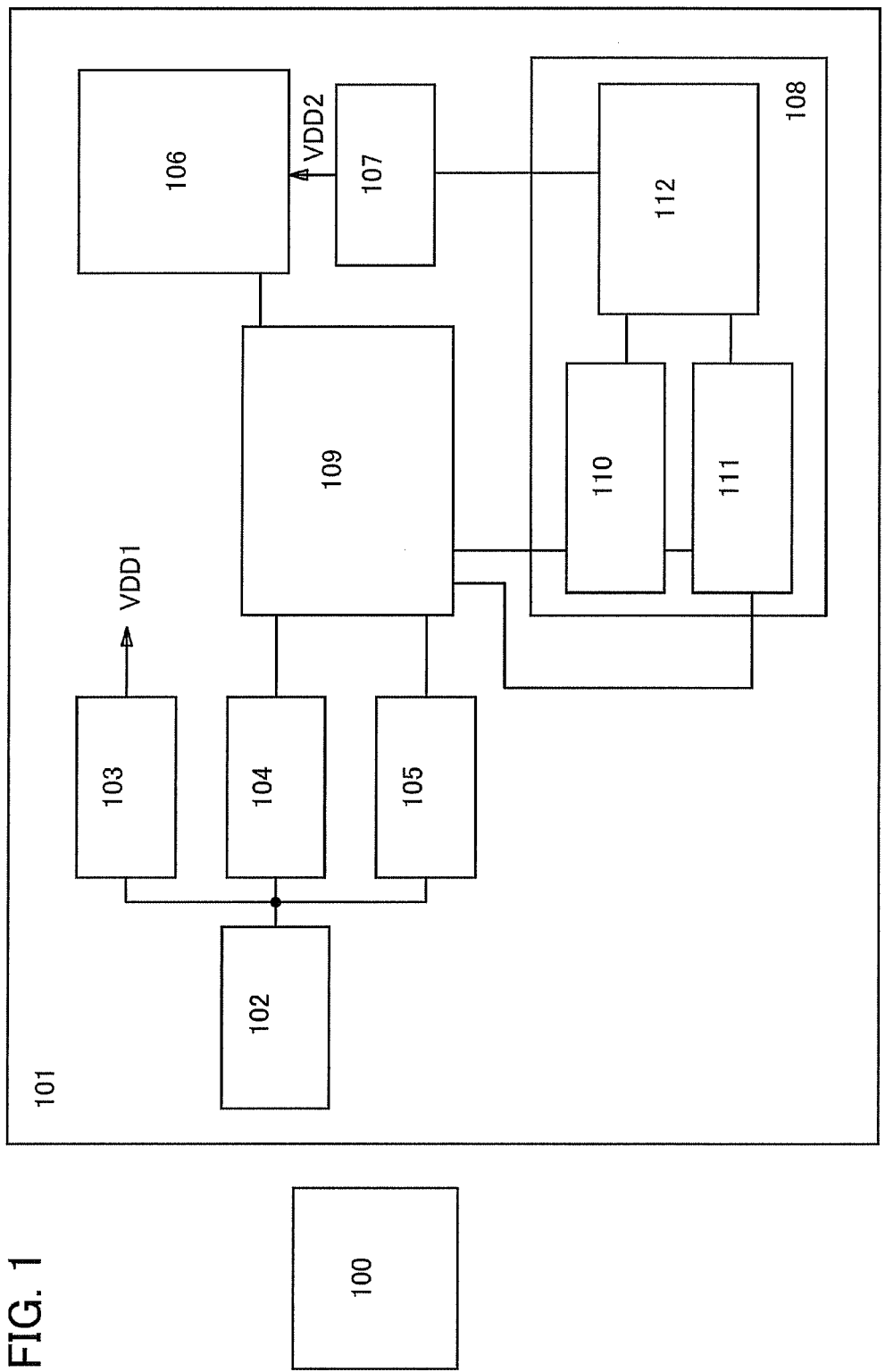
FIG. 1 is a block diagram of a semiconductor device of the present invention.

FIG. 1 shows a block diagram of a reader/writer 100 and a semiconductor device 101 of the present invention conducting wireless communication with the reader/writer 100.

The semiconductor device 101 includes the following: an antenna circuit 102 to receive a radio wave from the reader/writer 100 exchanging information with the semiconductor device 101; a power supply generation circuit 103 in which an alternating voltage generated by receiving a radio wave in the antenna circuit 102 is rectified into a direct voltage so that the direct voltage is supplied to various circuits in the semiconductor device 101; a demodulation circuit 104 to extract information which is included in the radio wave received in the antenna circuit 102; a modulation circuit 105 to modulate a radio wave for transmitting information from the semiconductor device 101 to the reader/writer 100; a memory 106 capable of storing data; a boosting circuit 107 for boosting a voltage supplied to the memory 106; a boosting control portion 108 for controlling operation of the boosting circuit 107; and a logic circuit 109.

The antenna circuit 102 has an antenna and a resonant capacitor which is connected to the antenna in parallel. The antenna is acceptable as long as it can receive a radio wave and convert the radio wave into an electric signal. For example, a dipole antenna, a patch antenna, a loop antenna, a Yagi antenna, or the like can be used for the antenna. Depending on a kind of an antenna, it is not always needed to provide the antenna circuit 102 with the resonant capacitor. In addition, a method for transmission and reception of a signal without wire in the antenna circuit 102 may be any of an electromagnetic coupling method, an electromagnetic induction method, and a radio wave method, for example.

The boosting control portion 108 has a control circuit 110 to control boosting time, an identification circuit 111 to identify command completion, and an identification circuit 112 to identify boosting possibility.

Next, a concrete operation of the semiconductor device 101 of the present invention is described. The antenna circuit 102 has the antenna and the resonant capacitor which is connected to the antenna in parallel. The antenna circuit 102 is capable of receiving a radio wave from the reader/writer first, transmitting the received signal to the power supply generation circuit 103 and the demodulation circuit 104, and transmitting data from the modulation circuit 105 to the reader/writer. The power supply generation circuit 103 rectifies the radio wave received by the antenna circuit 102 and generates a voltage VDD1 to operate the semiconductor device 101. The demodulation circuit 104 can extract data from the signal received by the antenna circuit 102 and transmits the data to the logic circuit 109. The modulation circuit 105 can accumulate data on the signal from the reader/writer through the antenna circuit 102 by Manchester method.

The memory 106 is a circuit capable of storing data or reading out stored data. The boosting circuit 107 can boost the voltage VDD1 generated from the power supply generation circuit 103 to a predetermined voltage VDD2. The logic circuit 109 can generate a signal to control operation of peripheral circuits such as the control circuit 110 to control boosting time, the identification circuit 111 to identify command completion, the memory 106, and the modulation circuit 105 based on data extracted from the demodulation circuit 104. With a writing signal obtained by analyzing a writing command from the reader/writer in the logic circuit 109, the control circuit 110 to control boosting time determines a period for giving the memory 106 the voltage VDD2 needed in writing data into the memory 106, and transmits a control signal to control boosting time, which includes the period for giving the memory 106 the voltage VDD2 required in writing information into the memory 106 as information, to the identification circuit 112 to identify boosting possibility. The identification circuit 111 to identify command completion transmits an identification signal to identify command completion to the identification circuit 112 to identify boosting possibility based on a detected EOF. Moreover, the identification circuit 111 to identify command completion transmits the identification signal to identify command completion, which includes the detected EFO as information, to the control circuit 110 to control boosting time. The identification circuit 112 to identify boosting possibility controls the boosting circuit 107.

Figure 2:
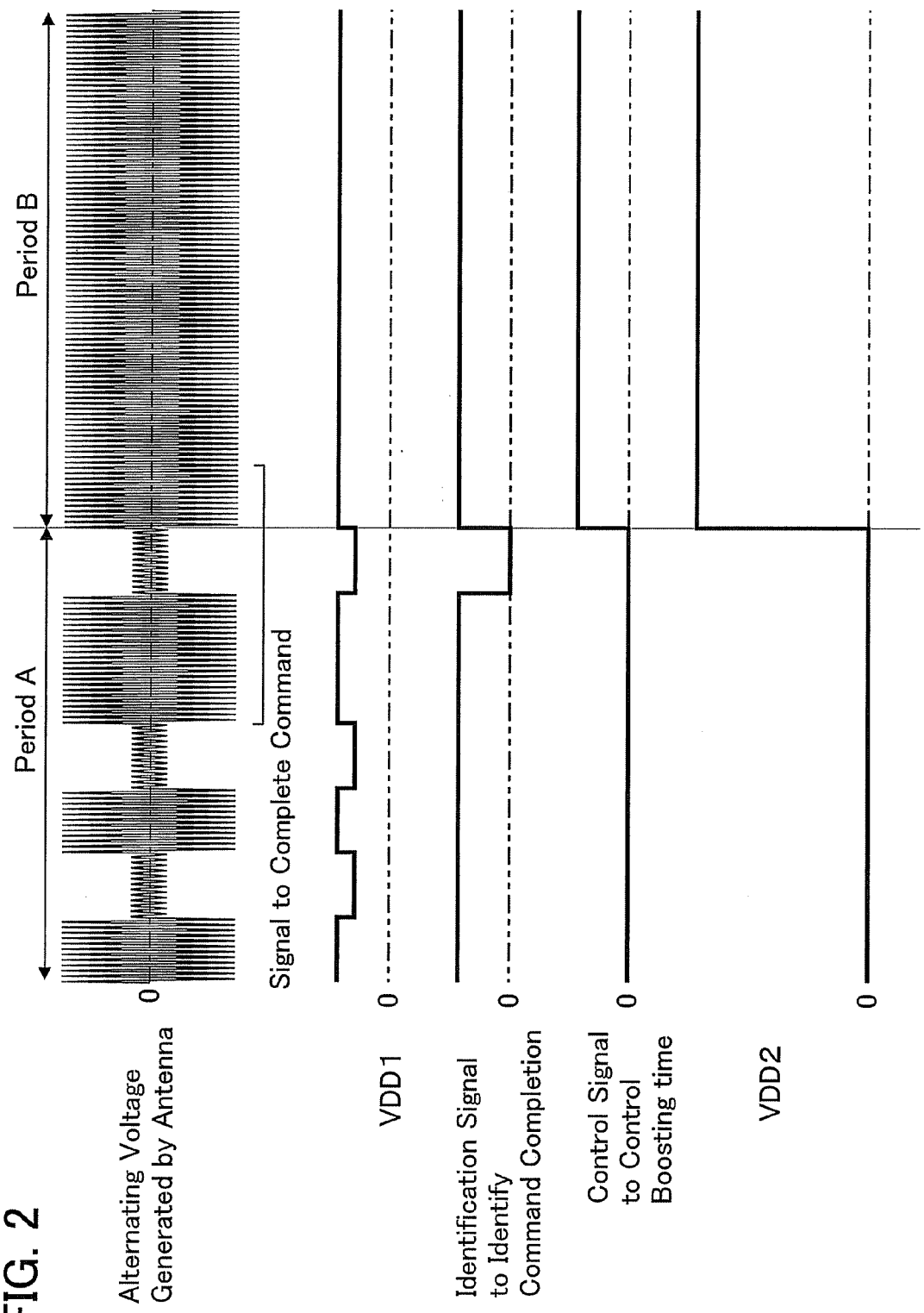
FIG. 2 is a timing chart of a semiconductor device of the present invention.

FIG. 2 is a timing chart showing the following: the alternating voltage generated in the antenna circuit 102 by receiving a radio wave which is transmitted from the reader/writer 100; the voltage VDD1 outputted from the power supply generation circuit 103; a identification signal to identify command completion voltage of the identification signal to identify command completion which is outputted from the identification circuit 111 to identify command completion; a control signal to control boosting time voltage of the control signal to control boosting time which is outputted from the control circuit 110 to control boosting time; and the voltage VDD2 supplied to the memory 106 from the boosting circuit 107.

In the timing chart of FIG. 2, a period A corresponds to a period before the signal to complete command including an EOF from the reader/writer 100 as information is completely transmitted to the semiconductor device 101. A period B corresponds to a period after transmission of the signal to complete command from the reader/writer 100.

Figure 3:
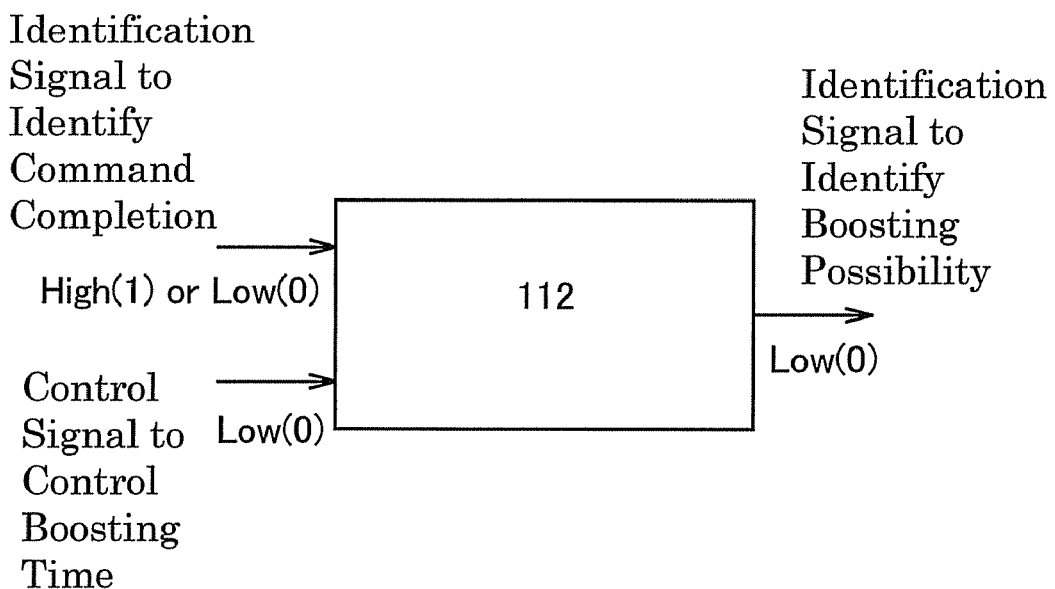
FIG. 3 is an input/output diagram of an identification signal to identify command completion, a control signal to control boosting time, and an identification signal to identify boosting possibility.
Figure 4:
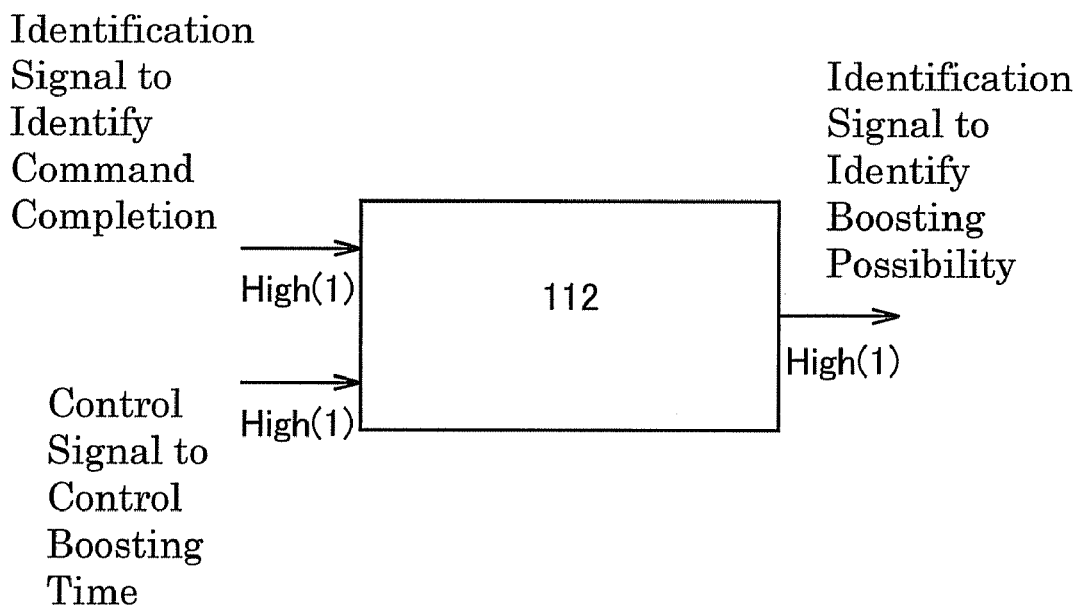
FIG. 4 is an input/output diagram of an identification signal to identify command completion, a control signal to control boosting time, and an identification signal to identify boosting possibility.

FIG. 3 shows an input/output diagram of the identification signal to identify command completion and the control signal to control boosting time which are inputted into the identification circuit 112 to identify boosting possibility, and the identification signal to identify boosting possibility which is outputted from the identification circuit 112 to identify boosting possibility during the period A in FIG. 2. FIG. 4 shows an input/output diagram of the identification signal to identify command completion and the control signal to control boosting time which are inputted into the identification circuit 112 to identify boosting possibility, and the identification signal to identify boosting possibility which is outputted from the identification circuit 112 to identify boosting possibility during the period B.

During the period A in FIG. 2, the control signal to control boosting time inputted into the identification circuit 112 to identify boosting possibility is kept at LOW (a logical value of zero). Thus, whether the identification signal to identify command completion inputted into the identification circuit 112 to identify boosting possibility is at HIGH (a logical value of 1) or a state of LOW (a logical value of zero), the identification signal to identify boosting possibility outputted from the identification circuit 112 to identify boosting possibility is kept at LOW (a logical value of zero). Consequently, the boosting circuit 107 does not boost the voltage VDD1.

During the period B in FIG. 2, the identification signal to identify command completion inputted into the identification circuit 112 to identify boosting possibility is kept at HIGH (a logical value of 1). When the identification signal to identify command completion is kept at HIGH (a logical value of 1), in addition, the control signal to control boosting time turns into at HIGH (a logical value of 1), the identification signal to identify boosting possibility is kept at HIGH (a logical value of 1) by the identification circuit 111 to identify command completion. Accordingly, the boosting circuit 107 boosts the voltage VDD1 during the period B. The voltage VDD2 supplied to the memory 106 stabilizes because the voltage VDD1 is boosted in a stable condition, whereby writing data into the memory 106 can be realized stably.

Next, the case where the boosting circuit 107 does not conduct boosting after the semiconductor device 101 receives the signal to complete command is described.

Figure 5:
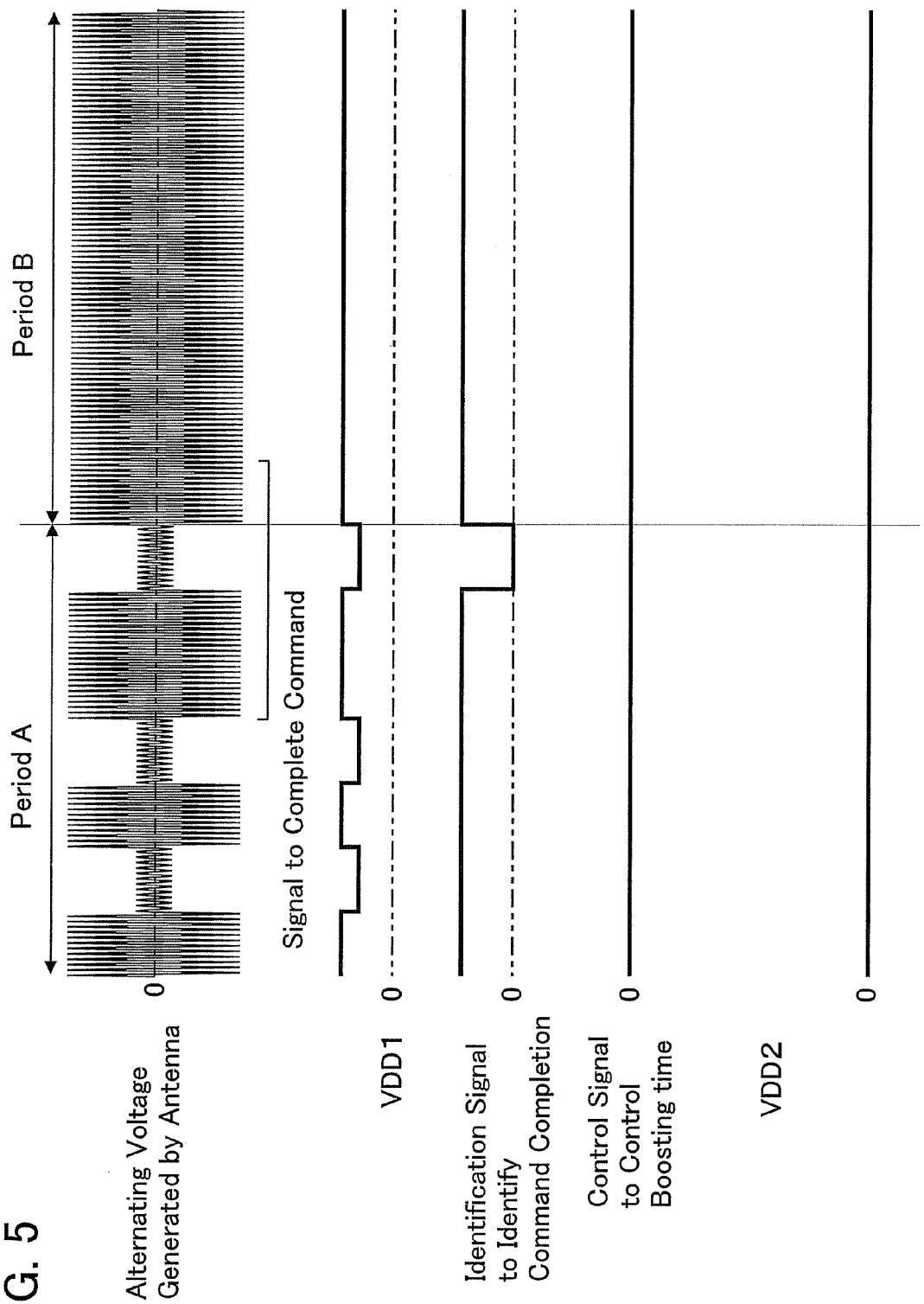
FIG. 5 is a timing chart of a semiconductor device of the present invention.

FIG. 5 shows a timing chart of an alternating voltage generated in the antenna circuit 102 by receiving a radio wave which is transmitted from the reader/writer 100, the voltage VDD1, a voltage of an identification signal to identify command completion, a voltage of a control signal to control boosting time, and the voltage VDD2 when the semiconductor device 101 receives a signal to complete command from the reader/writer 100. In the timing chart of FIG. 5, a period A corresponds to a period before a signal to complete command which includes an EOF from the reader/writer 100 as information is completely transmitted to the semiconductor device 101. In addition, a period B corresponds to a period after transmission of the signal to complete command from the reader/writer 100.

Figure 6:
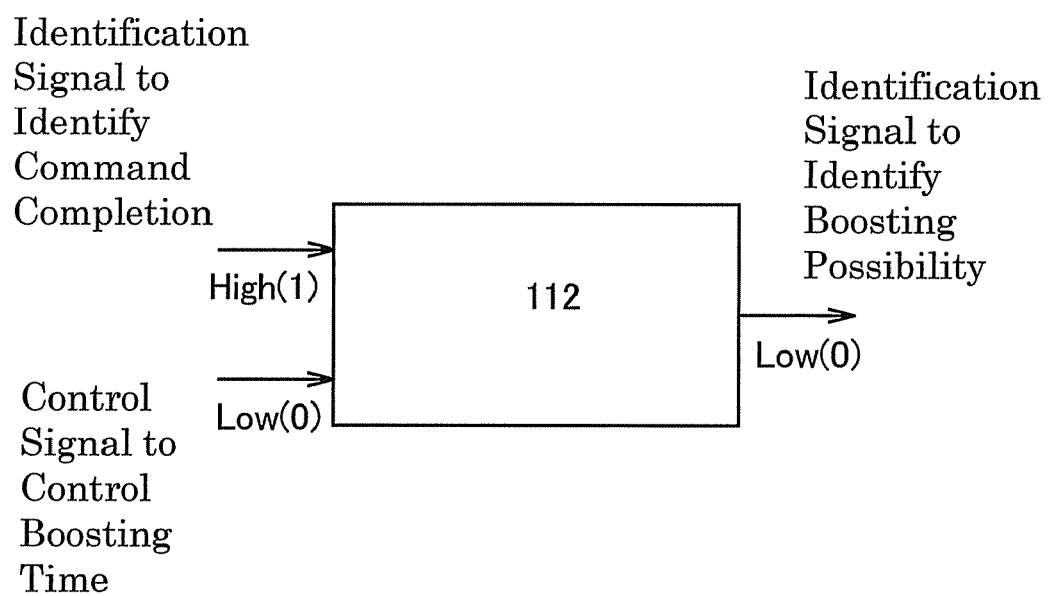
FIG. 6 is an input/output diagram of an identification signal to identify command completion, a control signal to control boosting time, and an identification signal to identify boosting possibility.

FIG. 6 shows an input/output diagram of the recognition signal to complete command and the control signal to control boosting time which are inputted into the identification circuit 112 to identify boosting possibility, and the identification signal to identify boosting possibility outputted from the identification circuit 112 to identify boosting possibility during the period B in FIG. 5.

During the period B in FIG. 5, the identification signal to identify command completion is at HIGH (a logical value of 1). However, since the control signal to control boosting time is kept at LOW (a logical value of zero), the identification signal to identify boosting possibility turns into LOW (a logical value of zero) by the identification circuit 111 to identify command completion. Accordingly, the boosting circuit 107 does not boost the voltage VDD1 during the period B.

Next, the case where the semiconductor device 101 cannot analyze a signal to complete command is described.

Figure 7:
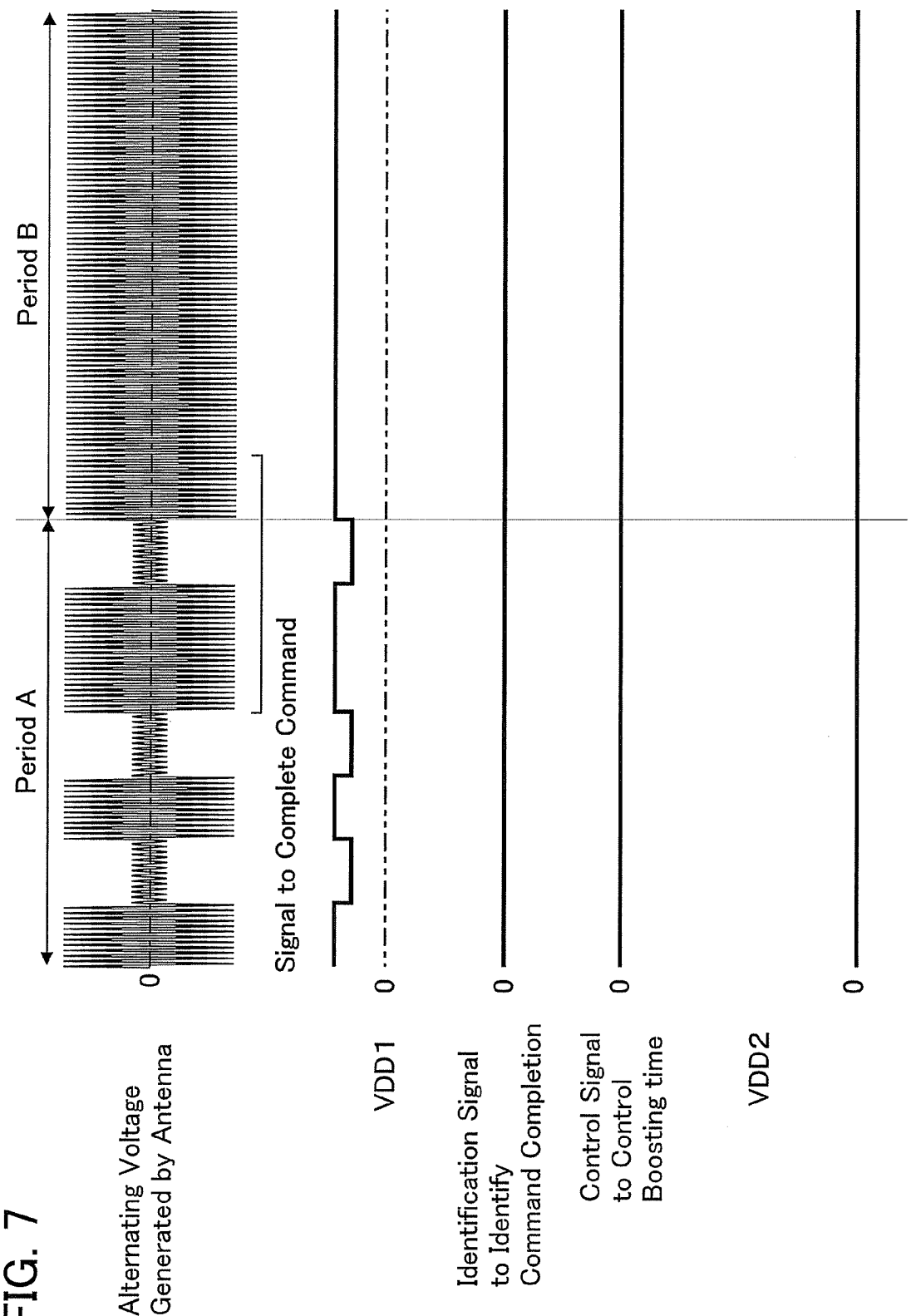
FIG. 7 is a timing chart of a semiconductor device of the present invention.

FIG. 7 shows a timing chart of an alternating voltage generated in the antenna circuit 102, a voltage VDD1, a voltage of an identification signal to identify command completion, a voltage of a control signal to control boosting time, and a voltage VDD2 when the semiconductor device 101 cannot analyze the signal to complete command and the writing signal. In a timing chart in FIG. 7, a period A corresponds to a period before a signal to complete command including an EOF as information from the reader/writer 100 transmitted to the semiconductor device 101 completely. In addition, a period B corresponds to a period after transmission of a signal to complete command from the reader/writer 100.

Figure 8:
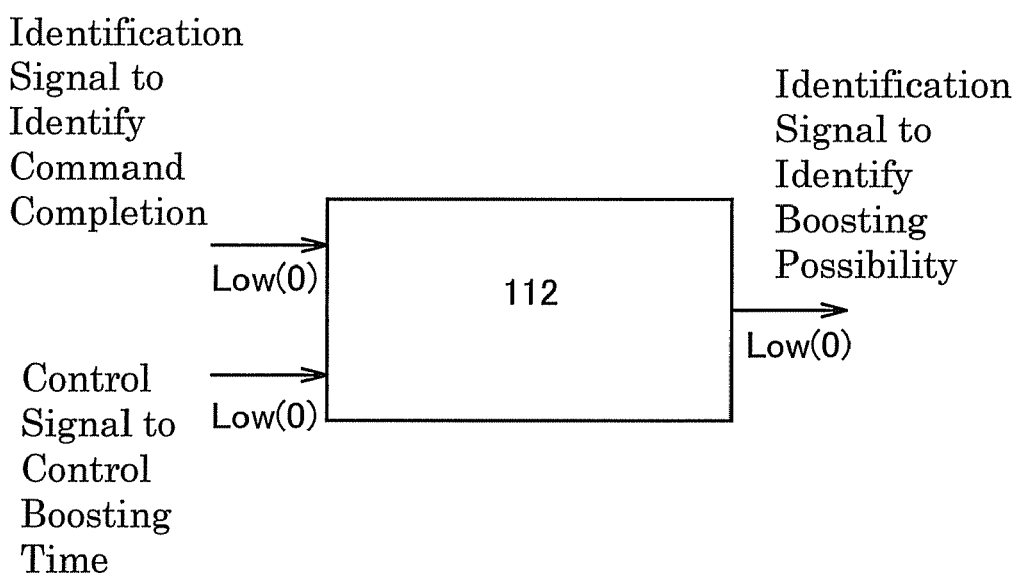
FIG. 8 is an input/output diagram of an identification signal to identify command completion, a control signal to control boosting time, and an identification signal to identify boosting possibility.

FIG. 8 shows an input/output diagram of an identification signal to identify command completion and a control signal to control boosting time which are inputted into the identification circuit 112 to identify boosting possibility, and an identification signal to identify boosting possibility outputted from the identification circuit 112 to identify boosting possibility during the period B in FIG. 7.

When the semiconductor device 101 cannot analyze the signal to complete command, as shown in the period B in FIG. 7, the signal to complete command turns into LOW (a logical value of zero). When the semiconductor device 101 cannot analyze the writing signal, as shown in the period B in FIG. 7, the control signal to control boosting time turns into LOW (a logical value of zero). When the identification signal to identify command completion is at LOW (a logical value of zero) and the control signal to control boosting time turns into LOW (a logical value of zero), the identification signal to identify boosting possibility turns into LOW (a logical value of zero) by the identification circuit 111 to identify command completion. Accordingly, the boosting circuit 107 does not boost the voltage VDD1 during the period B.

Figure 9:
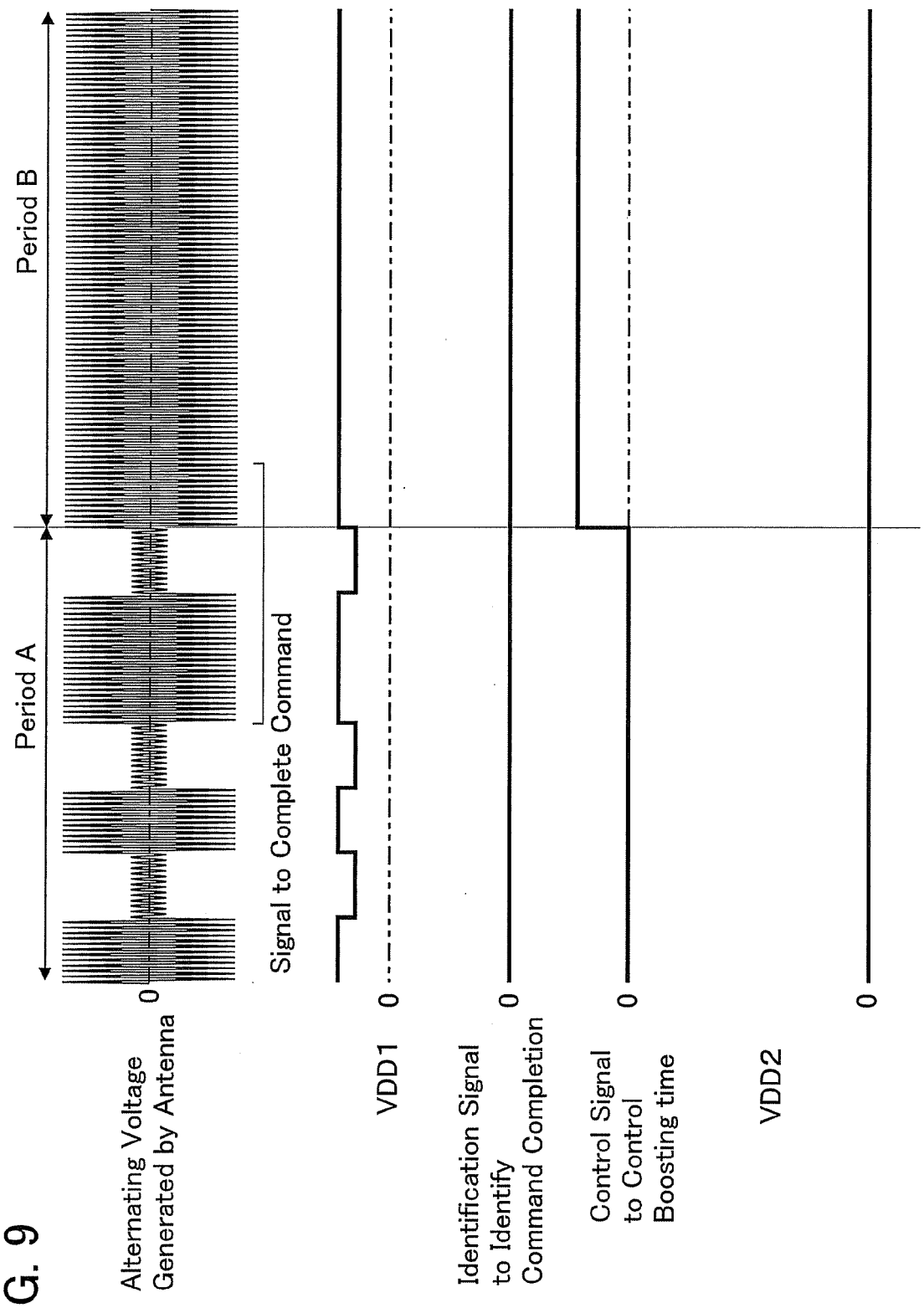
FIG. 9 is a timing chart of a semiconductor device of the present invention.

FIG. 9 shows a timing chart of an alternating voltage generated in the antenna circuit 102, a voltage VDD1, a voltage of an identification signal to identify command completion, a voltage of control signal to control boosting time, and a voltage VDD2 when the semiconductor device 101 can analyze the writing signal but cannot analyze the signal to complete command.

Figure 10:
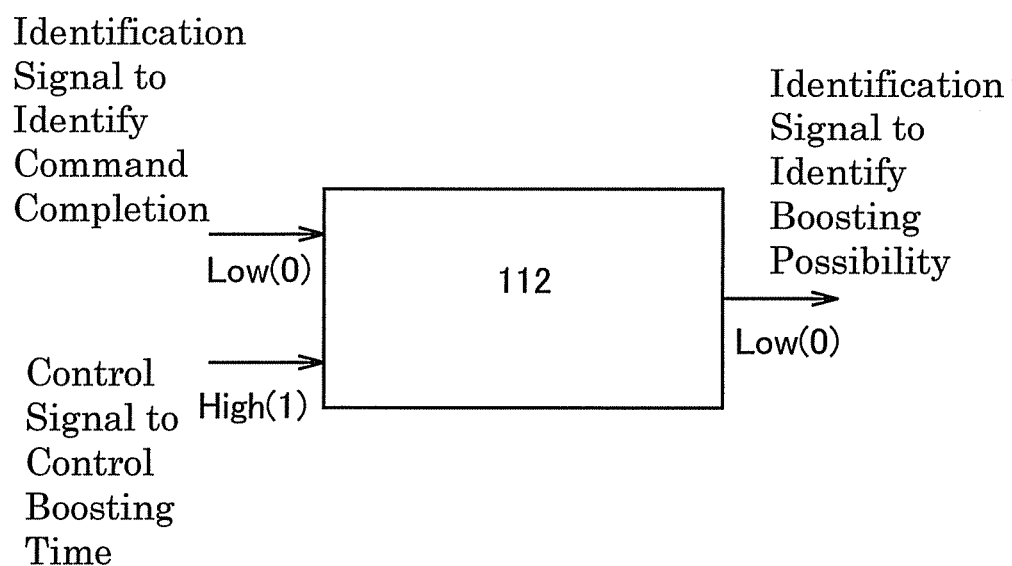
FIG. 10 is an input/output diagram of an identification signal to identify command completion, a control signal to control boosting time, and an identification signal to identify boosting possibility.

FIG. 10 shows an input/output diagram of the identification signal to identify command completion, the control signal to control boosting time, and the identification signal to identify boosting possibility during the period B in FIG. 9.

When the semiconductor device 101 cannot analyze the signal to complete command, as shown in the period B in FIG. 9, the identification signal to identify command completion turns into LOW (a logical value of zero). When the semiconductor device 101 can analyze the writing signal, as shown in the period B in FIG. 9, the control signal to control boosting time turns into HIGH (a logical value of 1). When the identification signal to identify command completion is at LOW (a logical value of zero) and the control signal to control boosting time turns into HIGH (a logical value of 1), the identification signal to identify boosting possibility turns into LOW (a logical value of zero) by the identification circuit 111 to identify command completion. Accordingly, the boosting circuit 107 does not boost the voltage VDD1 during the period B.

Using the present invention makes it possible to control a variation in the voltage VDD2 after being boosted up due to a modulation of a radio wave and to supply a stable voltage VDD 2 to the memory 106 by operating the semiconductor device 101 be dividing periods into the period A for transmission of a signal from the reader/writer 100 and the period B for boosting the voltage. As a result, it enables writing data into the memory 106 stably, whereby malfunction of the memory 106 can be prevented.

For a semiconductor device of the present invention, general semiconductor memories can be used as a memory which can control timing of boosting up. For example, volatile memories such as a DRAM (dynamic random access memory), an SRAM (static random access memory), or non-volatile memories such as a programmable ROM (read only memory) or an organic memory can be used. Moreover, although Embodiment Mode 1 described an aspect in the case of writing data into a memory, there is a memory which utilizes a boosted pressure in erasing stored data. For example, an EEPROM and a flash memory which are included in a programmable ROM are memories which utilize a boosted pressure in easing stored data. With employment of Embodiment Mode 1, data stored in a memory can be erased stably, whereby malfunction in erasing data in an EEPROM and a flash memory can be prevented.

Embodiment Mode 2

In this embodiment mode, an example of a concrete circuit structure of boosting possibility a circuit for identification of boosting possibility will be described.

Figure 11:
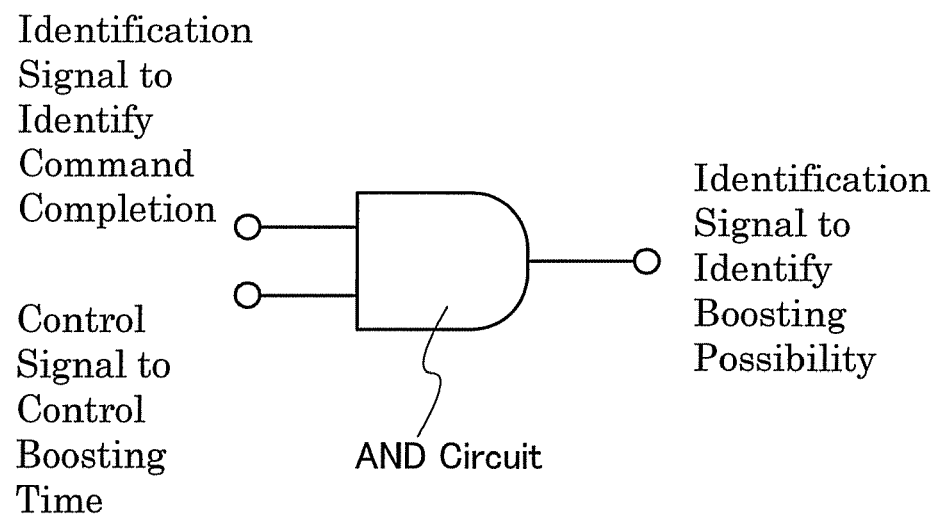
FIG. 11 is a circuit diagram of an identification circuit for boosting.

FIG. 11 shows a circuit diagram of boosting possibility a circuit for identification of boosting possibility. In this embodiment mode, the identification circuit to identify boosting possibility includes an AND circuit. Into each of the two input portions of the AND circuit, a control signal to control boosting time transmitted from a control circuit to control boosting time, and an identification signal to identify command completion transmitted from a identification circuit to identify command completion are inputted. Then, an identification signal to identify boosting possibility is outputted from the control circuit to control boosting time. Only when both the control signal to control boosting time and the identification signal to identify command completion which are inputted into the identification circuit to identify boosting possibility are at HIGH (a logical value of 1), the identification signal to identify boosting possibility turns into HIGH (a logical value of 1).

Embodiment Mode 3

In this embodiment mode, a structure of a semiconductor device of the present invention having a power storage means will be described.

Figure 12:
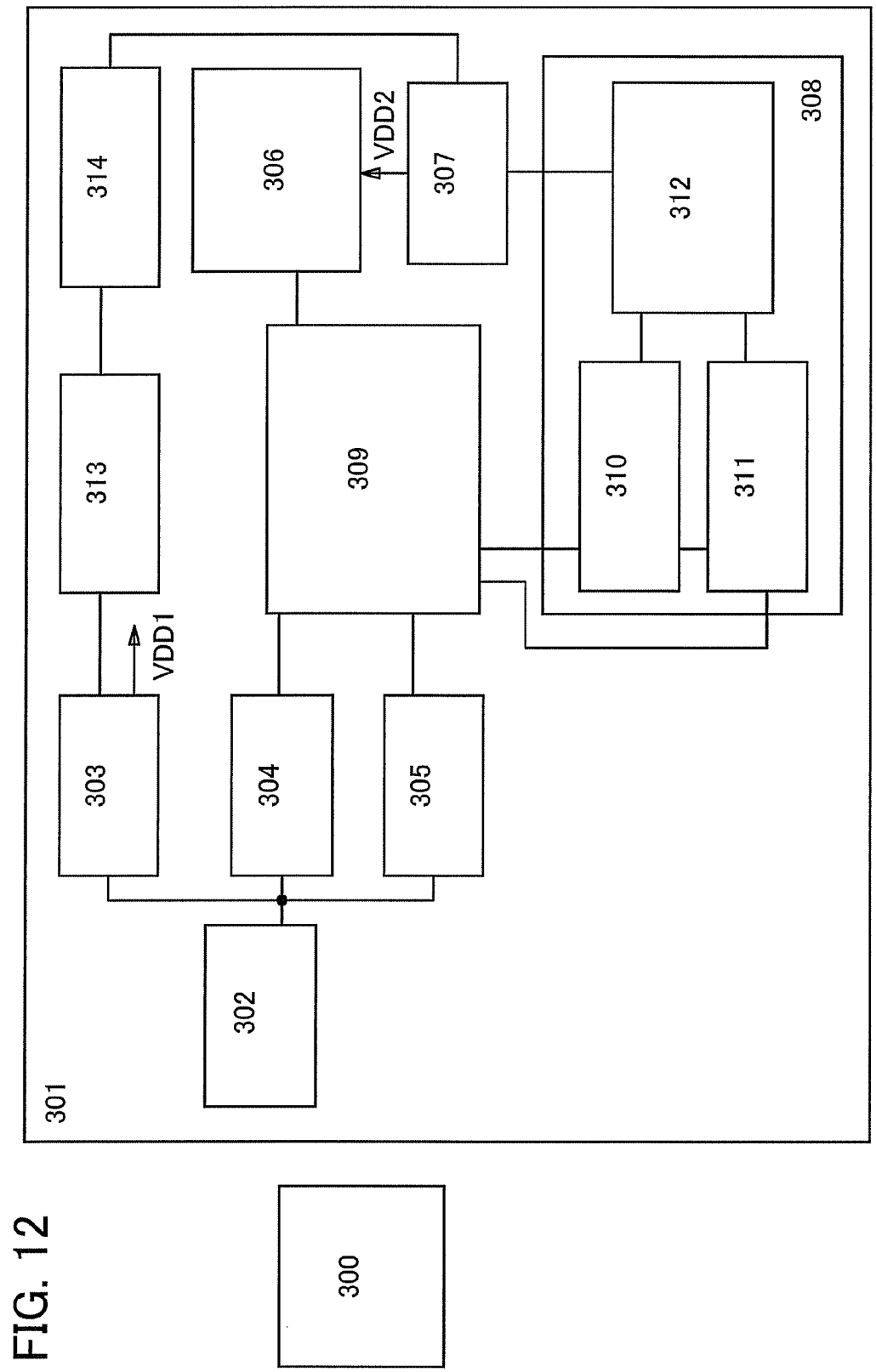
FIG. 12 is a block diagram of a semiconductor device of the present invention.

FIG. 12 shows a block diagram of a semiconductor device 301 in this embodiment mode. The semiconductor device 301 includes the following: an antenna circuit 302; a power supply generation circuit 303; a demodulation circuit 304; a modulation circuit 305; a memory 306; a boosting circuit 307; a logic circuit 309; a boosting control portion 308; a charging/discharging control circuit 313; and a power storage means 314. The boosting control portion 308 includes a control circuit 310 for boosting time, an identification circuit 311 for command completion, and an identification circuit 312 for boosting possibility.

The antenna circuit 302 has an antenna and a resonant capacitor connected to the antenna in parallel. The antenna circuit 302 is capable of receiving a radio wave from a reader/writer 300 first, transmitting the received signal to the power supply generation circuit 303 and the demodulation circuit 304, and transmitting data from the modulation circuit 305 to the reader/writer 300. The power supply generation circuit 303 rectifies a radio wave received by the antenna circuit 302 and generates a voltage VDD1 to operate semiconductor device 301. The generated voltage VDD1 is supplied to the charging/discharging control circuit 313. The demodulation circuit 304 can extract data from the wireless signal received by the antenna circuit 302 and transmits data to the logic circuit 309. The modulation circuit 305 accumulate data on the wireless signal in the reader/writer 300 through the antenna circuit 302 by Manchester method.

The memory 306 is a circuit capable of storing data or reading out stored data. The boosting circuit 307 can boost the voltage VDD1, which is generated from the power supply generation circuit 303, to a predetermined voltage VDD2. The logic circuit 309 can control predetermined operation like an operation signal of peripheral circuits such as the control circuit 310 for boosting time, the identification circuit 311 for command completion, the memory 306, and the modulation circuit 305 based on data extracted at the demodulation circuit 304. The control circuit 310 for boosting time determines a period for giving the memory 306 the voltage VDD2, which is needed in writing data into the memory 306, using a writing signal in which is a writing command from the reader/writer 300 is analyzed at the logic circuit 309. Then, the control circuit 310 for boosting time transmits a control signal to control boosting time, which includes the period for giving the memory 306 the required voltage VDD2 in writing data into the memory 306 as information, to the identification circuit 312 for boosting possibility.

The identification circuit 311 for command completion transmits a signal to the identification circuit 312 for boosting possibility based on an EOF detected at the logic circuit 309. Further, the identification circuit 311 for command completion transmits a signal including the detected EOF as information to the control circuit 310 for boosting time. The identification circuit 312 for boosting possibility controls the boosting circuit 307. The charging/discharging control circuit 313 is capable of charging the power storage means 314 with surplus power when the voltage VDD1 generated by the power generation circuit 303 can secure sufficient power for operating the semiconductor device 301. In addition, for stable boosting of the voltage VDD1 in the boosting circuit 307, the charge/discharge control circuit 313 utilizes power charged in the power storage means 314 and supports VDD1 and/or VDD2 such that the voltage VDD2 can be stably supplied.

Embodiment 1

As a transistor used in a semiconductor device of the present invention, a thin film transistor using a polycrystalline semiconductor, a microcrystal semiconductor, and an amorphous semiconductor can be used. As well as a thin film transistor, a transistor formed using single crystal silicon, a transistor formed using SOI, or the like can be used. Alternatively, a transistor using an organic semiconductor, and a transistor using a carbon nanotube may be used. A transistor provided for a semiconductor device of the present invention may have a single-gate structure, a double-gate structure, or a multi-gate structure with three gate electrodes or more. The antenna circuit in the semiconductor device of the present invention may comprise the above transistor. The power supply generation circuit in the semiconductor device of the present invention may comprise the above transistor. The demodulation circuit in the semiconductor device of the present invention may comprise the above transistor. The modulation circuit in the semiconductor device of the present invention may comprise the above transistor. The memory in the semiconductor device of the present invention may comprise the above transistor. The boosting circuit in the semiconductor device of the present invention may comprise the above transistor. The boosting control portion in the semiconductor device of the present invention may comprise the above transistor. The logic circuit in the semiconductor device of the present invention may comprise the above transistor.

Figure 16:
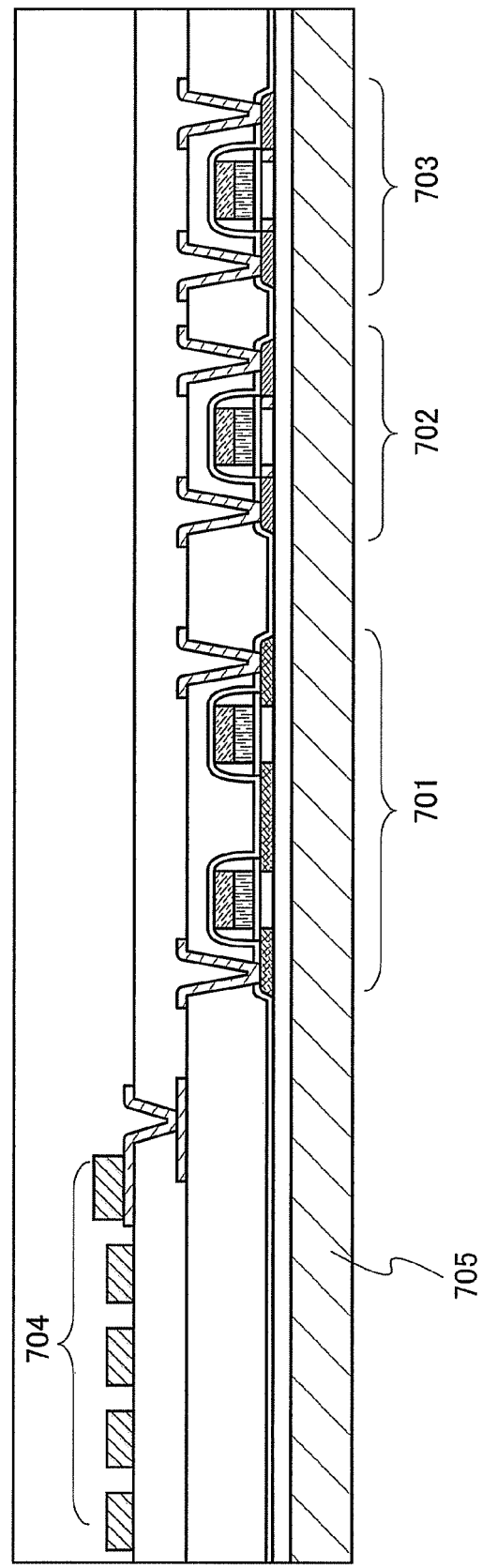
FIG. 16 is a cross-sectional view of a semiconductor device of the present invention.
Figure 17:
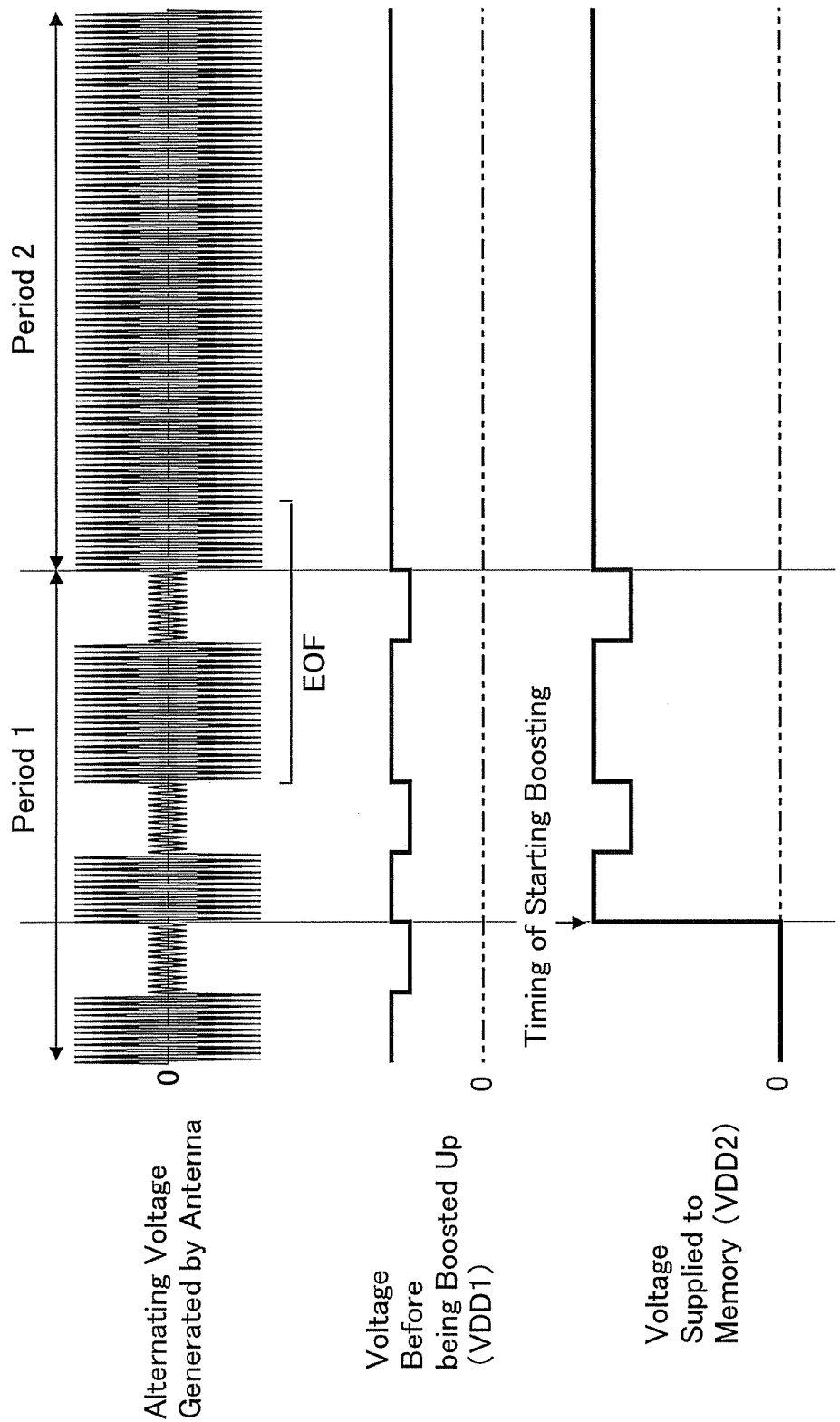
FIG. 17 is a timing chart of a conventional wireless tag.

FIG. 16 shows an example of a cross-sectional view of a semiconductor device of the present invention using a thin film transistor. The semiconductor device shown in FIG. 16 includes a p-channel thin film transistor 701, an n-channel thin film transistors 702 and 703. In FIG. 16, the p-channel thin film transistor 701 is a double gate structure having two gate electrodes electrically connected to each other. However, it may be a single gate structure or a multi gate structure having three gate electrodes or more. In FIG. 16, each of the n-channel thin film transistors 702 and 703 is single gate structures having one gate electrode. However, each transistor may be a multi-gate structure with a plurality of gate electrodes electrically connected to each other.

The semiconductor device shown in FIG. 16 has an antenna 704. The antenna 704 in FIG. 16 is formed over a substrate 705 over which the p-channel thin film transistor 701, and the n-channel thin film transistors 702 and 703 are formed. However, the antenna 704 is not necessarily formed over the substrate 705. After being separately formed, the antenna 704 may be electrically connected to a circuit formed of thin film transistors such as the p-channel thin film transistor 701, and the n-channel thin film transistors 702 and 703.

Although the antenna 704 has a coiled shape, the shape can be changed as appropriate in accordance with frequency of a radio wave to be received.

Note that a thin film transistor formed using a thin semiconductor film tends to have low capability in current supply compared to a transistor using a single-crystal semiconductor film. Accordingly, in the case of a semiconductor device formed using a thin film transistor, the voltage VDD2 after being boosted tends to be less stable when communication from a reader/writer to a wireless tag is conducted. However, using the present invention makes it possible to operate a semiconductor device with periods divided into a period for signal communication and a period for boosting the voltage, whereby the voltage VDD2 after being boosted likely to stabilize even if a thin film transistor is used.

This embodiment can be implemented with combination of Embodiment Modes 1 to 3 as appropriate.

Embodiment 2

Figure 13:
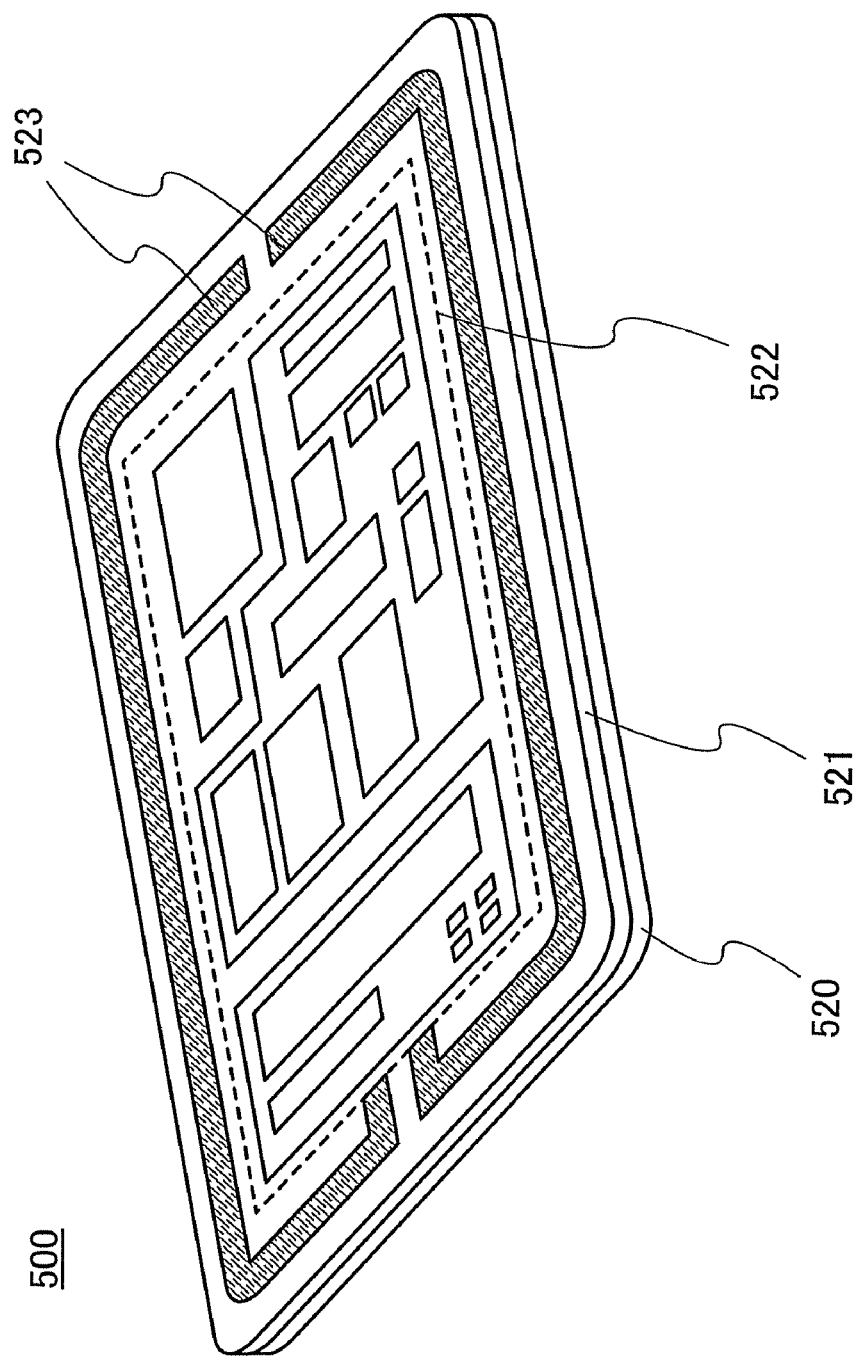
FIG. 13 is a perspective view showing one aspect of a semiconductor device of the present invention.

FIG. 13 shows a perspective view of one aspect of a semiconductor device of the present invention.

In FIG. 13, a semiconductor device 500 includes a substrate 520 and a cover member 521. For the substrate 520 and the cover member 521, a glass substrate, a quartz substrate, or a plastic substrate can be used.

An antenna circuit 523 and an integrated circuit 522 including a power supply generation circuit, a demodulation circuit, a modulation circuit, a logic circuit, a memory, a boosting circuit, and a boosting control portion are formed over the substrate 520. The cover member 521 overlaps the substrate 520 to cover the integrated circuit 522 and the antenna circuit 523. Note that the antenna circuit 523 may be formed over the substrate 520, or may be separately prepared and attached to the substrate 520.

Communication between the reader/writer and the semiconductor device 500 can be conducted by modulating a radio wave used for a carrier (a carrier wave). In this embodiment, a structure of a semiconductor device using a carrier of 950 MHz is shown, but frequency of a carrier is not limited to this. As a carrier, various radio waves of frequency such as 125 kHz and 13.56 MHz can be utilized. A transmission method of signal can be classified into various kinds such as an electromagnetic coupling method, an electromagnetic induction method, a microwave method depending on wavelength of a carrier. A method of a modulation has variants such as an amplitude modulation, a frequency modulation, and a phase modulation; however, it is not particularly limited.

In this embodiment, since a semiconductor device in the case of communication utilizing an electric field is illustrated, a dipole antenna is used for the antenna circuit 523. In communication utilizing a magnetic field rather than an electric field, a coiled antenna can be used for the antenna circuit 523.

In this embodiment, although the structure of the semiconductor device 500 having the antenna circuit 523 is described, the semiconductor device of the present invention does not necessarily have the antenna circuit 523.

All the semiconductor device of the present invention including a capacitor can be formed by a normal process for a MOS.

This embodiment can be implemented with combination of the embodiment mode 1 to 3 as appropriate.

Embodiment 3

The semiconductor device of the present invention is applicable in a wider field because of high reliability due to the memory whose operation can be stabilized.

Figure 14A:
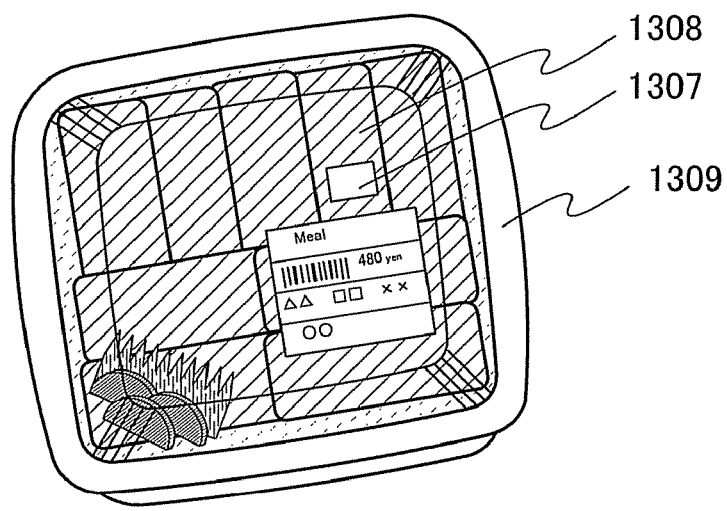
FIGS. 14A and 14B are views showing application modes of a semiconductor device of the present invention.

In FIG. 14A, a lunch 1309 for sale is wrapped with a packing material 1308 to which a semiconductor device 1307 of the present invention is attached. A packing material corresponds to a support, for example, a wrap, a PET bottle, a tray, and a capsule which can be molded or has been already molded for wrapping an object. By recording the price and the like for items in the semiconductor device 1307, a register functioning as an interrogator can be used in the payment of the lunch 1309.

Further, for example, application for distribution management of items using the semiconductor device is possible with the semiconductor device of the present invention to which labels of the items are attached.

Figure 14B:
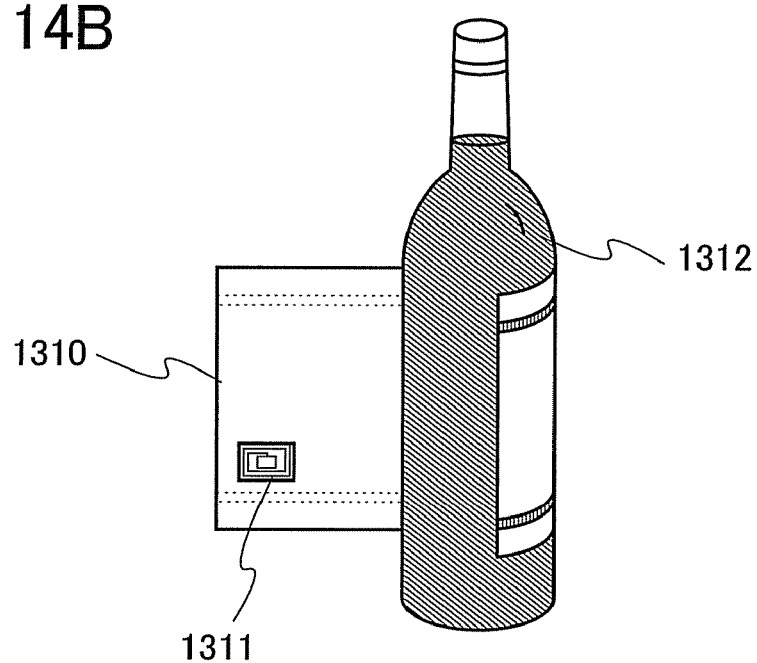

As shown in FIG. 14B, a semiconductor device 1311 of the present invention is attached to a support like a label 1310 of an item having adhesiveness on a back surface. Then, the label 1310 to which the semiconductor device 1311 is attached is put on an item 1312. Identification information concerning the item 1312 can be read wirelessly from the semiconductor device 1311 affixed to the label 1310. Accordingly, using semiconductor device 1311 makes it easy to manage items in a distribution process.

For example, when a nonvolatile memory capable of being written is used for a memory included in an IC in the semiconductor device 1311, a process of distribution of the item 1312 can be recorded. In addition, a record of a process in a production area of items helps wholesalers, retailers, and consumers to know a source, a producer, date of manufacture, and a processing method, and the like.

This embodiment can be implemented with combination of Embodiment Mode 1 to 3, and Embodiments 1 and 2.

Embodiment 4

Figure 15A:
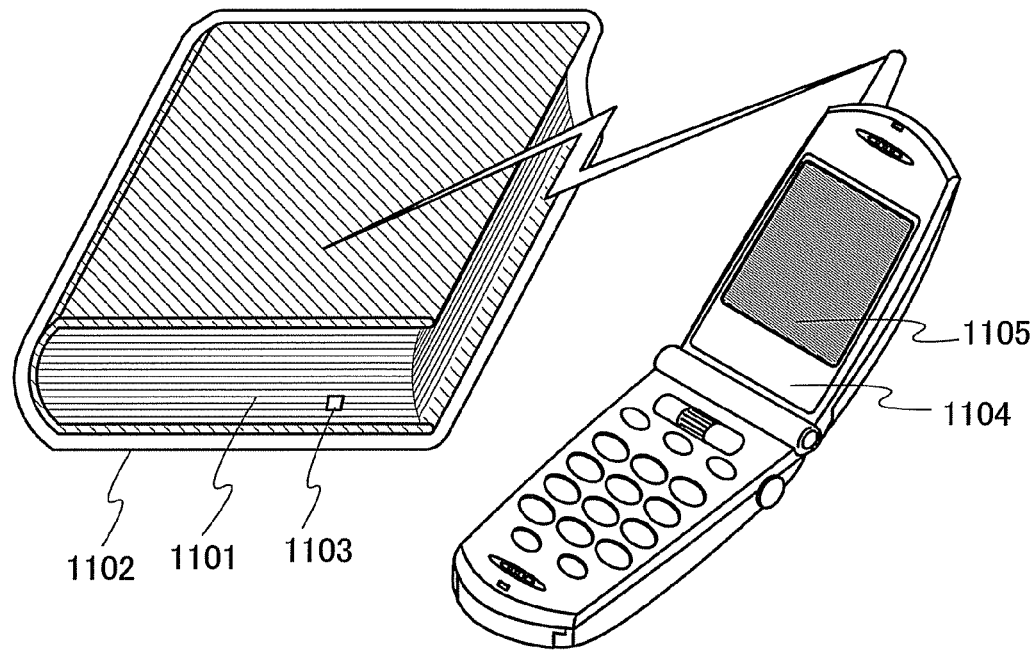
FIGS. 15A and 15B are views showing application modes of a semiconductor device of the present invention.

In this embodiment, application of the semiconductor device of the present invention will be described. As shown in FIG. 15A, in the case of items having value on their contained information, for example, books, DVDs, and CDs, there is a problem in that disclosure of total information contained in the items lowers their value as items; on the other hand, veiling information completely makes it difficult to appreciate their value as items.

Wrapping the above items with a wrapping material to which the semiconductor device of the present invention is affixed, and then storing a part of information contained in the items in the semiconductor device enable customers to appreciate value of the items without lowering value of the items. FIG. 15A shows a book 1101 wrapped with a wrapping material 1102 to which a semiconductor device 1103 of the present invention is affixed.

Figure 15B:
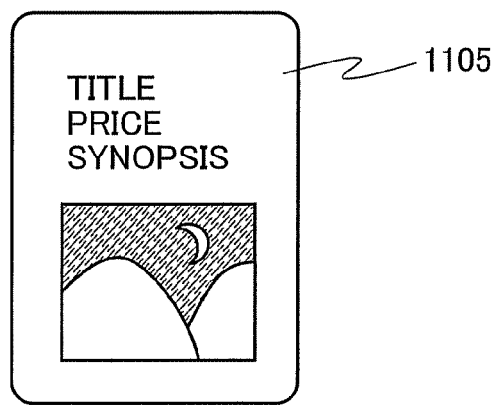

Then, for example, a portable information terminal like a mobile phone to which a function as an interrogator is added has customers grasp part of contents of the book 1101. In FIG. 15B, the contents of the book 1101 is displayed on a display portion 1105 of a mobile phone 1104.

According to the above structure, even if total information contained in the items is not disclosed, customers can know the contents of the items.

This embodiment can be implemented with combination of Embodiment Mode 1 to 3, and Embodiments 1 and 2.

Embodiment 5

In this embodiment, a specific structure of an identification circuit to identify command completion, boosting possibility a circuit for identification of boosting possibility, and a control circuit to control boosting time will be described.

Figure 18A:
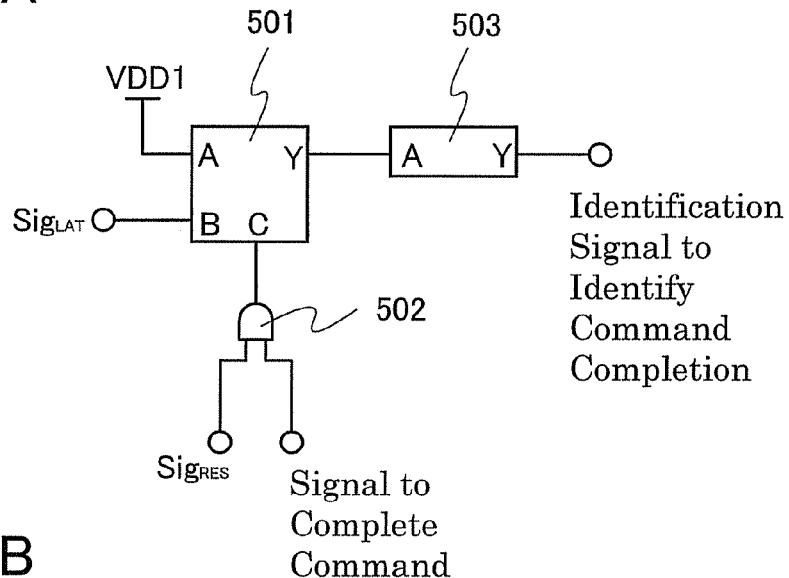
FIGS. 18A and 18B are circuit diagrams of an identification circuit to identify command completion and a circuit for identification of boosting possibility.

FIG. 18A shows a circuit diagram of the identification circuit to identify command completion as an example. The identification circuit to identify command completion shown in FIG. 18A includes a D-flip-flop 501 with a reset, an AND 502, and a buffer 503.

A signal to complete command including an EOF extracted at a logic circuit is inputted into the AND 502. In addition, a reset signal ($Sig_{RES}$) to initialize data held in the D-flip-flop 501 with the reset is inputted into the AND 502. An output signal from the AND 502 is inputted into the D-flip-flop 501 with the reset.

A signal ($Sig_{LAT}$) for controlling timing to start writing data into a memory is inputted into the D-flip-flop with the reset as well as the signal outputted from the AND 502. Moreover, the D-flip-flop 501 with the reset is supplied with a voltage VDD1 generated in an electric power supply generation circuit. Then, the identification signal to identify command completion outputted from the D-type flip-flop 501 with the reset is outputted from the identification circuit to identify command completion after being rectified by the buffer 503, and then inputted into the control circuit to control boosting time.

Figure 19:
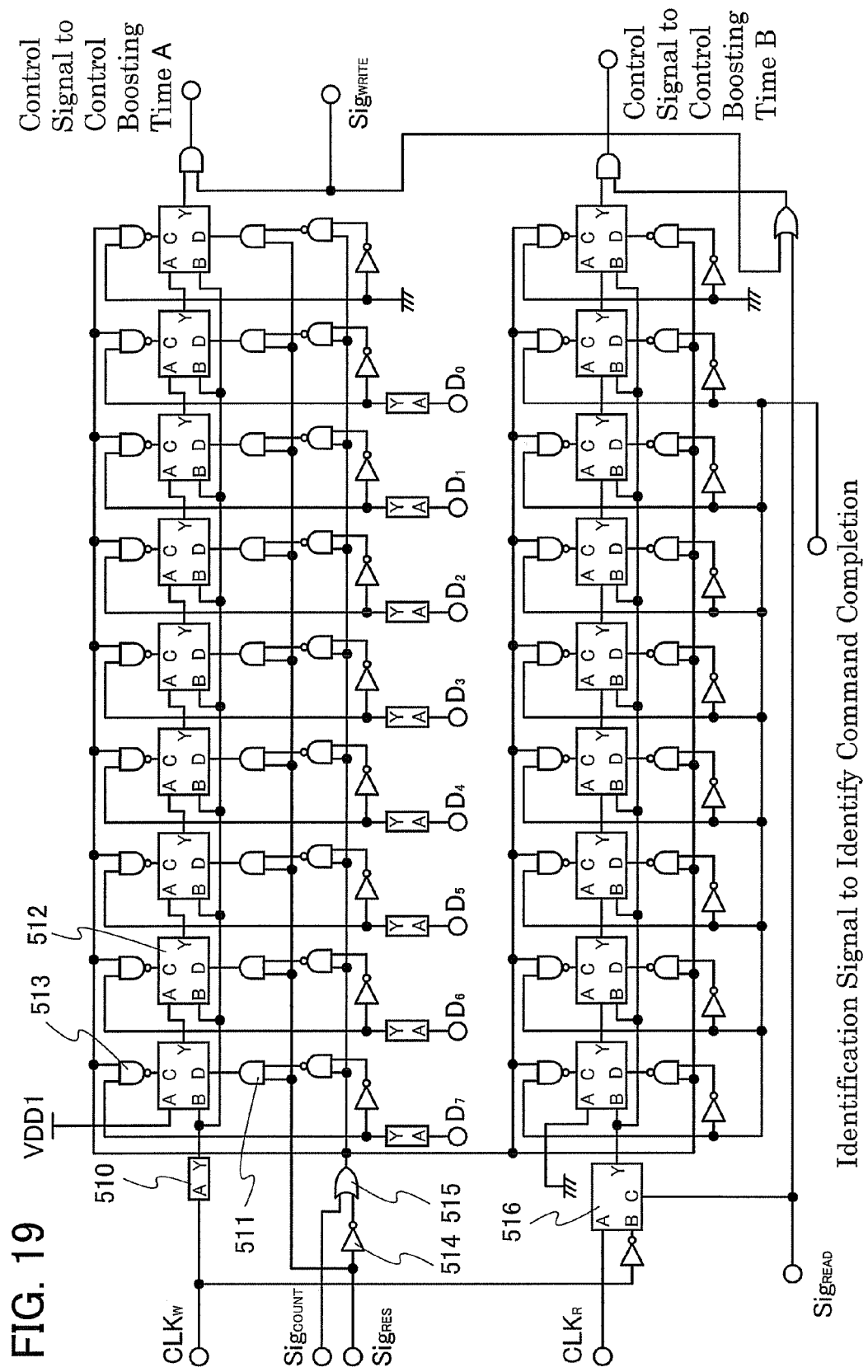
FIG. 19 is a circuit diagram of a control circuit to control boosting time.

FIG. 19 shows a circuit diagram of a control circuit to control boosting time as an example. The control circuit to control boosting time shown in FIG. 19 includes a plurality of buffers 510, a plurality of ANDs 511, a plurality of D-type flip-flops 512 with the resets, a plurality of NANDs 513, a plurality of inverters 514, a plurality of ORs 515, and a plurality of multiplexers 516. Data to be inputted into a memory is inputted into the control circuit to control boosting time. The control circuit to control boosting time shown in FIG. 19 illustrates the case where data of 8 bits shown in $D_0$ to $D_7$ is inputted.

In addition, into the control circuit to control boosting time, inputted the following: the identification signal to identify command completion; a clock pulse ($CL_{KW}$) for writing to control time for writing data of 1 bit into a memory; a clock pulse ($CL_{KR}$) for reading out to control time for reading data of 1 bit from the memory; a reset signal ($Sig_{RES}$) to initialize data held in the D-type flip-flop 512 with the reset; a mode selection signal for writing ($Sig_{WRITE}$) to identify if the mode is a mode in which data is written into the memory (a writing mode); a selection signal for reading out ($Sig_{READ}$) to identify if the mode is a mode in which data is read out from the memory (a reading out mode); and a control signal to identify if the identification signal to identify command completion is inputted into the control circuit to control boosting time ($Sig_{COUNT}$) so that the control circuit to control boosting time can surely operate in accordance with the identification signal to identify command completion.

A writing signal includes the data $D_0$ to $D_7$ of 8 bits and the mode selection signal for writing ($Sig_{WRITE}$) to identify if the mode in which the data is written into the memory (a writing mode).

Then, the control signal to control boosting time which is a digital signal of 2 bits is outputted from the control circuit to control boosting time and inputted into the identification circuit to identify boosting possibility. In FIG. 19, the control signal to control boosting time outputted from the control circuit to control boosting time is shown as control signals A and B for boosting time for each bit.

Figure 18B:
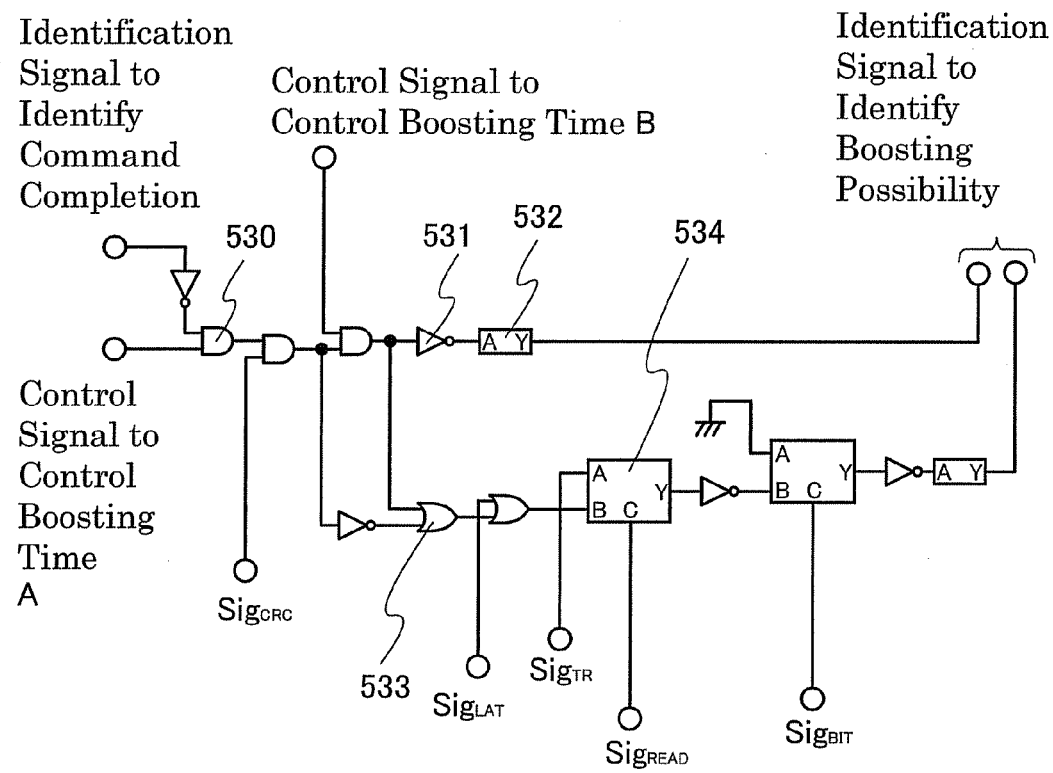

FIG. 18B shows a circuit diagram of the identification circuit to identify boosting possibility as an example. The identification circuit to identify boosting possibility shown in FIG. 18B includes an AND 530, a plurality of inverters 531, a plurality of buffers 532, a plurality of ORs 533, and a plurality of multiplexers 534. Then, into the identification circuit to identify boosting possibility, the control signal to control boosting time functioning as a digital signal of 2 bits outputted from the control circuit to control boosting time is inputted for each bit.

In addition, into the identification circuit to identify boosting possibility inputted the following: the identification signal to identify command completion; a timing control signal ($Sig_{LAT}$) to start writing data into a memory; a timing control signal ($Sig_{TR}$) for reading out to control the timing of starting the reading mode; a selection signal ($Sig_{READ}$) for reading out to identify if the mode is a mode in which the data is read out from the memory (a reading out mode); a bit number control signal ($Sig_{BIT}$) to disable writing data into the memory when a bit number of data transmitted from an interrogator outnumbers a predetermined number; and a inspection signal ($Sig_{CRC}$) including an inspected result whether the whole data transmitted from the interrogator can be received or not in a cyclic redundancy inspection circuit as information.

In the identification circuit to identify boosting possibility, the identification signal to identify boosting possibility is generated by inputting the identification signal to identify command completion and the control signal A for boosting time into the AND 530. The identification signal to identify boosting possibility functioning as a digital signal of 2 bits can be outputted from the identification circuit to identify boosting possibility and inputted into the boosting circuit.

Note that in this embodiment, the identification circuit to identify command completion, a control circuit to control boosting time, and the identification circuit to identify boosting possibility are shown as a completely independent aspect of the present invention; however the invention is not limited to this structure. It may be a structure in which the identification circuit to identify command completion, the control circuit to control boosting time, and the identification circuit to identify boosting possibility are partially dependent and share one or a plural logic gates.

This embodiment can be implemented with combination of Embodiment Mode 1 to 3, and Embodiments 1 to 4.

This application is based on Japanese Patent Application serial no. 2006-346887 filed with Japan Patent Office on Dec. 25, 2006, the entire contents of which are hereby incorporated by reference.

What is claimed is:

1. A semiconductor device comprising:
a power supply generation circuit configured to generate a direct current voltage from an alternating voltage which is generated from a radio wave;
a demodulation circuit configured to extract data from the alternating voltage;
a memory;
a boosting circuit configured to boost up the direct current voltage and to supply the boosted direct current voltage to the memory; and
a boosting control portion comprising:
a command completion identification circuit configured to generate a first information for starting the boosting in accordance with a command completion signal of the data;
a boosting time control circuit configured to generate a second information for controlling a time to supply the boosted direct current voltage to the memory in accordance with a writing signal of the data; and
a boosting possibility identification circuit configured to control the boosting circuit in accordance with the first information and the second information, so that the direct current voltage is boosted up after detecting the command completion signal of the data.

2. The semiconductor device according to claim 1, further comprising:
an antenna circuit configured to generate the alternating voltage from the radio wave.

3. The semiconductor device according to claim 1, wherein the memory comprises one of an EEPROM and a flash memory.

4. The semiconductor device according to claim 1, wherein the boosting control portion comprise a thin film transistor.

5. The semiconductor device according to claim 1, further comprising:
a power storage configured to support the direct current voltage; and
a charging control circuit configured to control the power storage.

6. A semiconductor device comprising:
a power supply generation circuit configured to generate a direct current voltage from an alternating voltage which is generated from a radio wave;
a demodulation circuit configured to extract data from the alternating voltage;
a memory;
a logic circuit comprising a first thin film transistor, configured to receive the data from the demodulation circuit;
a boosting circuit configured to boost up the direct current voltage and to supply the boosted direct current voltage to the memory;
a boosting control portion comprising:
a command completion identification circuit configured to generate a first information for starting the boosting in accordance with a command completion signal of the data from the logic circuit,
a boosting time control circuit configured to generate a second information for controlling a time to supply the boosted direct current voltage to the memory in accordance with a writing signal of the data from the logic circuit, and
a boosting possibility identification circuit configured to control the boosting circuit in accordance with the first information and the second information, so that the direct current voltage is boosted up after detecting the command completion signal of the data from the logic circuit.

7. The semiconductor device according to claim 6, further comprising:
an antenna circuit configured to generate the alternating voltage from the radio wave.

8. The semiconductor device according to claim 6, wherein the memory comprises one of an EEPROM and a flash memory.

9. The semiconductor device according to claim 6, wherein the boosting control portion comprise a second thin film transistor.

10. The semiconductor device according to claim 6, further comprising:
a power storage configured to support the direct current voltage; and
a charging control circuit configured to control the power storage.

11. A method for driving a semiconductor device comprising the step of:
generating a direct current voltage from an alternating voltage which is generated from a radio wave;
extracting data from the alternating voltage;
generating first information in accordance with a command completion signal of the data;
generating a second information in accordance with a writing signal of the data;
boosting up the direct current voltage after detecting the command completion signal of the data in accordance with the first information and the second information; and
supplying the boosted direct current voltage to a memory,
wherein the first information is for starting the boosting, and
wherein the second information is for controlling a time to supply the boosted direct current voltage to the memory.

12. The method according to claim 11, further comprising the step of,
receiving the radio wave from a interrogator.

13. The method according to claim 11,
wherein the memory comprises one of an EEPROM and a flash memory.

14. The method according to claim 11, further comprising the step of:
attaching the semiconductor device to an item, before the step of generating the direct current voltage, and
wherein the data includes identification information concerning the item.

15. The method according to claim 11, further comprising the steps of:
charging a power storage using the direct voltage; and
supporting the direct current voltage.

* * * * *